United States Patent
Shih et al.

(10) Patent No.: US 11,189,715 B2
(45) Date of Patent: Nov. 30, 2021

(54) SEMICONDUCTOR DEVICE AND MANUFACTURING METHOD THEREOF

(71) Applicant: Powerchip Semiconductor Manufacturing Corporation, Hsinchu (TW)

(72) Inventors: Kuo-Sheng Shih, Hsinchu (TW); Hung-Kwei Liao, Taoyuan (TW); Chen-Chiang Liu, Hsinchu County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/858,717

(22) Filed: Apr. 27, 2020

(65) Prior Publication Data
US 2021/0288167 A1    Sep. 16, 2021

(30) Foreign Application Priority Data
Mar. 12, 2020    (TW) ................. 109108160

(51) Int. Cl.
*H01L 29/737* (2006.01)
*H01L 29/66* (2006.01)

(52) U.S. Cl.
CPC .... *H01L 29/7371* (2013.01); *H01L 29/66242* (2013.01)

(58) Field of Classification Search
CPC ....... H01L 29/7371; H01L 29/66242
See application file for complete search history.

(56) References Cited

U.S. PATENT DOCUMENTS

| 5,557,118 A | 9/1996 | Hashimoto |
| 5,656,514 A * | 8/1997 | Ahlgren ............ H01L 29/66242 438/320 |

(Continued)

FOREIGN PATENT DOCUMENTS

| TW | I394275 | 4/2013 |
| TW | I559532 | 11/2016 |
| TW | I636569 | 9/2018 |

OTHER PUBLICATIONS

"Office Action of Taiwan Counterpart Application", dated Jan. 5, 2021, pp. 1-4.

*Primary Examiner* — Syed I Gheyas
(74) *Attorney, Agent, or Firm* — JCIPRNET

(57) ABSTRACT

A semiconductor device and a manufacturing method thereof are provided. The semiconductor device includes first and second epitaxial layers, and first and second semiconductor layers. The second epitaxial layer is disposed on the first epitaxial layer. The first semiconductor layer extends from above the second epitaxial layer to a top surface of the second epitaxial layer. A vertically extending region of the first semiconductor layer has a body portion and an extending portion extending from a bottom end of the body portion to the second epitaxial layer. A width of the body portion is greater than a width of the extending portion. The second semiconductor layer is disposed on the second epitaxial layer, and laterally surrounds the vertically extending region of the first semiconductor layer. A portion of the second semiconductor layer extends between and overlaps with the body portion of the first semiconductor layer and the second epitaxial layer.

4 Claims, 9 Drawing Sheets

(56) References Cited

U.S. PATENT DOCUMENTS

| | | | |
|---|---|---|---|
| 5,668,022 A * | 9/1997 | Cho | H01L 29/66242 438/320 |
| 6,410,396 B1 | 6/2002 | Casady et al. | |
| 6,870,204 B2 | 3/2005 | Torvik et al. | |
| 8,871,599 B2 | 10/2014 | Donkers et al. | |
| 9,318,585 B1 | 4/2016 | Cai et al. | |
| 9,324,846 B1 | 4/2016 | Camillo-Castillo et al. | |

* cited by examiner

SEMICONDUCTOR DEVICE AND MANUFACTURING METHOD THEREOF

CROSS-REFERENCE TO RELATED APPLICATION

This application claims the priority benefit of Taiwan application serial no. 109108160, filed on Mar. 12, 2020. The entirety of the above-mentioned patent application is hereby incorporated by reference herein and made a part of this specification.

BACKGROUND

Technical Field

The present disclosure relates to a semiconductor device and a manufacturing method thereof, and particularly, to a heterojunction bipolar transistor (HBT) device and a manufacturing method thereof.

Description of Related Art

A bipolar junction transistor (BJT) is a semiconductor device with three terminals. As compared to a single polarity transistor (e.g., a field effect transistor), the BJT is conducted by both of electrons and holes, thus available in either polarity. The BJT can be functioned as a signal amplifier, and has advantages including great control of power, high operation speed, great durability and so forth.

A heterojunction bipolar transistor (HBT) is a type of the BJT. Emitter and base terminals of HBT are made of different materials, thus a heterojunction is formed between the emitter terminal and the base terminal. As compared to a homogeneous BJT, the HBT can be utilized under higher frequency. Therefore, the HBT can be applied in communication devices, high speed circuits or so forth.

SUMMARY

A HBT device with increased operation frequency and a manufacturing method of such HBT device are provided.

An aspect of the present disclosure provides a semiconductor device. The semiconductor device comprises: a first epitaxial layer, having a first conductive type; a second epitaxial layer, disposed on the first epitaxial layer, and having a second conductive type complementary to the first conductive type; a first semiconductor layer, extending from above the second epitaxial layer to a top surface of the second epitaxial layer, and having the first conductive type, wherein a vertically extending region of the first semiconductor layer has a body portion and an extending portion below the body portion and extending from a bottom end of the body portion to the second epitaxial layer, and a width of the body portion is greater than a width of the extending portion; and a second semiconductor layer, disposed on the second epitaxial layer and laterally surrounding the vertically extending region of the first semiconductor layer, wherein a portion of the second semiconductor layer extends between the body portion of the first semiconductor layer and the second epitaxial layer, and is overlapped with the body portion of the first semiconductor layer and the second epitaxial layer along a vertical direction.

In some embodiments, the portion of the second semiconductor layer is laterally spaced apart from the extending portion of the first semiconductor layer.

In some embodiments, the portion of the second semiconductor layer is in lateral contact with the extending portion of the first semiconductor layer through a pad pattern.

In some embodiments, the semiconductor device further comprises: an insulating layer, extending between the body portion of the first semiconductor layer and the second semiconductor layer, and between the body portion of the first semiconductor layer and the pad pattern.

In some embodiments, the first semiconductor layer further has a laterally extending region, the vertically extending region is located below the laterally extending region and extending downwardly from a bottom end of the laterally extending region, and the laterally extending region is spaced apart from the second semiconductor layer along a vertical direction.

In some embodiments, the laterally extending region of the first semiconductor layer is in contact with the second semiconductor layer through a dielectric layer.

Another aspect of the present disclosure provides a manufacturing method of a semiconductor device. The method comprises: sequentially forming a first epitaxial layer and a second epitaxial layer on a substrate; forming a pad pattern and a mask pattern on the second epitaxial layer, wherein the pad pattern is located between the second epitaxial layer and the mask pattern, and a sidewall of the pad pattern is laterally recessed from a sidewall of the mask pattern; forming a first semiconductor layer on the second epitaxial layer, wherein a sidewall of the mask pattern is covered by the first semiconductor layer, the first semiconductor layer extends to a space between the mask pattern and the second epitaxial layer, and a topmost end of the first semiconductor layer is lower than a top surface of the mask pattern; removing the mask pattern, to expose an inner sidewall of the first semiconductor layer and a top surface of the pad pattern; removing a central portion of the pad pattern, to expose a portion of the second epitaxial layer; and forming a second semiconductor layer on the exposed portion of the second epitaxial layer.

In some embodiments, a method for forming the first semiconductor layer comprises: forming a semiconductor material layer on the second epitaxial layer, wherein the mask pattern is covered by the semiconductor material layer; and performing an etch back process on the semiconductor material layer, to form the first semiconductor layer.

In some embodiments, the manufacturing method further comprising: forming an insulating layer covering the inner sidewall of the first semiconductor layer and the top surface of the pad pattern after removal of the mask pattern; forming a sidewall spacer on the insulating layer, wherein the inner sidewall of the first semiconductor layer and a peripheral portion of the pad pattern are covered by the sidewall spacer; removing a portion of the insulating layer by using the sidewall spacer as a shadow mask, so as to expose the central portion of the pad pattern; and removing the sidewall spacer before removal of the central portion of the pad pattern.

In some embodiments, the central portion of the pad pattern is removed by an isotropic etching process.

As above, the semiconductor device of the present disclosure may be a HBT device, and includes an epitaxial layer as a base, a semiconductor layer as a contact layer of the base, and another semiconductor layer as an emitter. The emitter extends to the base from above the base, and a vertically extending region of the emitter has a body portion and an extending portion extending from a bottom end of the body portion to a top surface of the base. The base contact layer laterally surrounds the vertically extending region, and further extends to a recess defined between the body portion of the emitter and the base. As a result, a contact area between the base contact layer and the base is increased, and a contact resistance between the base contact layer and the base is reduced. Such contact resistance is in negative correlation to an operation frequency of the semiconductor device. Therefore, reduction of such contact resistance may allow the semiconductor device to be operated under higher frequency.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
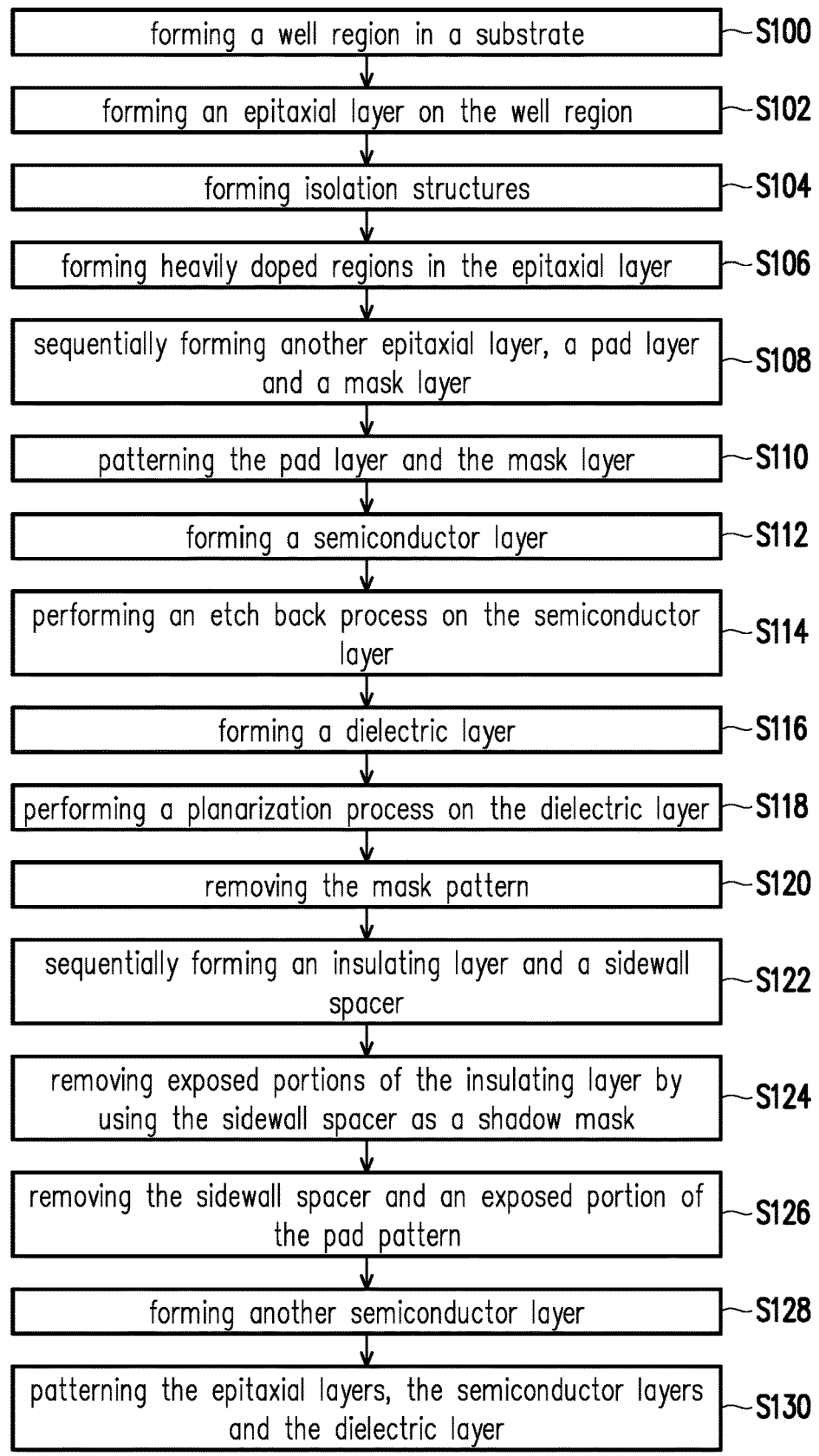
FIG. 1 is a flow diagram illustrating a manufacturing method of a semiconductor device according to some embodiments of the present disclosure.
Figure 2A:
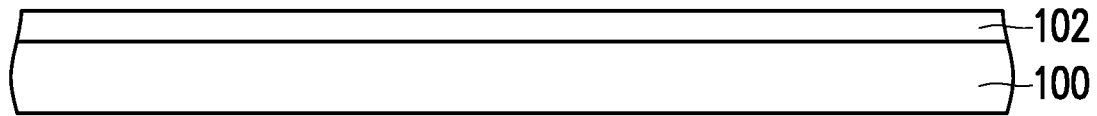
FIG. 2A through FIG. 2P are schematic cross-sectional views illustrating structures at various stages during the manufacturing process of the semiconductor device as shown in FIG. 1.

FIG. 1 is a flow diagram illustrating a manufacturing method of a semiconductor device according to some embodiments of the present disclosure. FIG. 2A through FIG. 2P are schematic cross-sectional views illustrating structures at various stages during the manufacturing process of the semiconductor device as shown in FIG. 1.

According to some embodiments of the present disclosure, the semiconductor device is a bipolar junction transistor (BJT) device, such as a heterojunction bipolar transistor (HBT) device. In some embodiments, the manufacturing method of the semiconductor device includes the following steps.

Referring to FIG. 1 and FIG. 2A, step S100 is performed, and a well region 102 is formed in a substrate 100. In some embodiments, the substrate 100 is a semiconductor substrate or a semiconductor-on-insulator (SOI) substrate. A semiconductor material in the semiconductor substrate or the SOI substrate may include an elemental semiconductor (e.g., Si, Ge or the like), a semiconductor alloy (e.g., SiGe), a compound semiconductor (e.g., group III-V semiconductor or the like) or so forth, and the semiconductor material may be doped with a first conductive type or a second conductive type complementary to (or opposite to) the first conductive type. For instance, the first conductive type may be N-type, while the second conductive type may be P-type. The well region 102 extends into the substrate 100 from a top surface of the substrate 100. In some embodiments, a conductive type of the well region 102 is different from the conductive type of the substrate 100. For instance, the substrate 100 has the first conductive type, while the well region 102 has the second conductive type. Since the well region 102 will be covered by other components in the following steps, the well region 102 is also referred as a buried well. In addition, in some embodiments, the well region 102 is formed by performing an ion implantation process on the substrate 100.

Figure 2B:
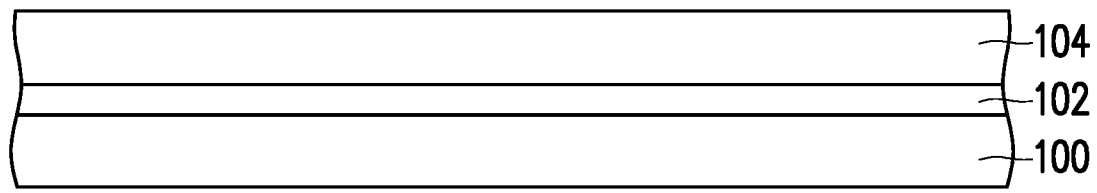

Referring to FIG. 1 and FIG. 2B, step S102 is performed, and an epitaxial layer 104 is formed on the well region 102. In some embodiments, the epitaxial layer 104 may be functioned as a collector of the eventually formed HBT device, whereas the well region 102 may be a portion of a contact region for routing a base of the eventually formed HBT. In these embodiments, the epitaxial layer 104 and the well region 102 have the same conductive type (e.g., the first conductive type). In addition, a doping concentration of the epitaxial layer 104 may be less than a doping concentration of the well region 102. Alternatively, the doping concentration of the epitaxial layer 104 is substantially identical to or greater than the doping concentration of the well region 102. In some embodiments, the epitaxial layer 104 and the substrate 100 are made of different materials. For instance, the material of the substrate 100 may include Si, while the material of the epitaxial layer 104 may include SiC. However, those skilled in the art may select other suitable materials for the substrate 100 and the epitaxial layer 104 according to process requirements, the substrate 100 and the epitaxial layer 104 do not have to be made of different materials.

Figure 2C:
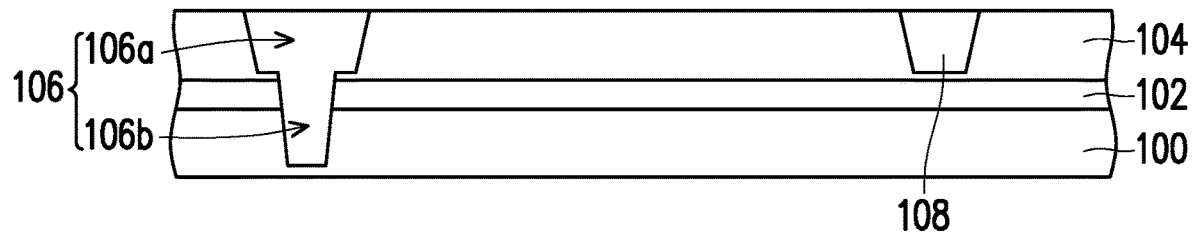

Referring to FIG. 1 and FIG. 2C, step S104 is performed, and an isolation structure 106 and an isolation structure 108 are formed in the current structure. The isolation structure 106 and the isolation structure 108 define an active region of the eventually formed HBT device (i.e., a space between isolation structure 106 and the isolation structure 108). It should be noted that, as shown in FIG. 2C, the isolation structure 106 and the isolation structure 108 appear as two separate structures. Nevertheless, top view patterns of the isolation structure 106 and the isolation structure 108 (not shown) may actually be connected with each other, and laterally surround the afore-mentioned active region. In some embodiments, the isolation structure 106 extends from a surface of the epitaxial layer 104 into the substrate 100 through the well region 102. In these embodiments, the isolation structure 106 may have an upper portion 106a and a lower portion 106b. The upper portion 106a extends into the epitaxial layer 104 from a top surface of the epitaxial layer 104. In some embodiments, the upper portion 106a may not penetrate through the epitaxial layer 104, such that a bottom end of the upper portion 106a is higher than a bottom surface of the epitaxial layer 104. The lower portion 106b may extend from the bottom end of the upper portion 106a into the substrate 100 through the well region 102. In some embodiments, a width of the upper portion 106a is greater than a width of the lower portion 106b. On the other hand, the isolation structure 108 may be structurally identical to the upper portion 106a of the isolation structure 106, and extends into the epitaxial layer 104 from the top surface of the epitaxial layer 104. The isolation structure 106 and the isolation structure 108 may respectively be formed by an insulating material. In certain embodiments, a conductive material or a semiconductor material (not shown) may be further filled in the lower portion 106b of the isolation structure 106. In these certain embodiments, the conductive material or the semiconductor material may be surrounded by the insulating material, such that a bottom surface and a sidewall of the conductive material or the semiconductor material are covered by the insulating material.

Figure 2D:
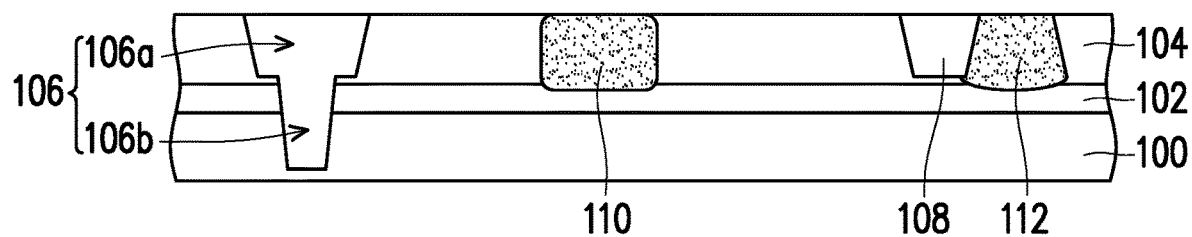

Referring to FIG. 1 and FIG. 2D, step S106 is optionally performed, and a heavily doped region 110 and a heavily doped region 112 are formed in the epitaxial layer 104. The heavily doped regions 110, 112 extend downwardly from the top surface of the epitaxial layer 104 to the well region 102 through the epitaxial layer 104. In some embodiments, the heavily doped region 110 and the heavily doped region 112 may further extend into the well region 102. The heavily doped region 110 is located within the active region defined by the isolation structure 106 and the isolation structure 108, whereas the heavily doped region 112 may be located outside the active region. In other words, the heavily doped region 110 may be located between the isolation structure 106 and the isolation structure 108, while the heavily doped region 112 may be located aside the isolation structures 106, 108. The heavily doped region 110, the heavily doped region 112, the epitaxial layer 104 and the well region 102 have the first conductive type, and a doping concentration of the heavily doped regions 110, 112 may be greater than the doping concentration of the epitaxial layer 104. The well region 102 and the heavily doped region 112 may collectively be functioned as a contact region of the collector of the eventually formed HBT device. In addition, by disposing the heavily doped region 110, a profile of a depletion region between the collector and the subsequently formed base can be adjusted. The heavily doped region 110 may be disposed when the HBT device is used in low-voltage applications. Alternatively, the heavily doped region 110 may be omitted when the HBT device is used in intermediate-voltage or high-voltage applications. In some embodiments, the heavily doped region 110 and the heavily doped region 112 are formed by using at least one ion implantation process.

Figure 2E:
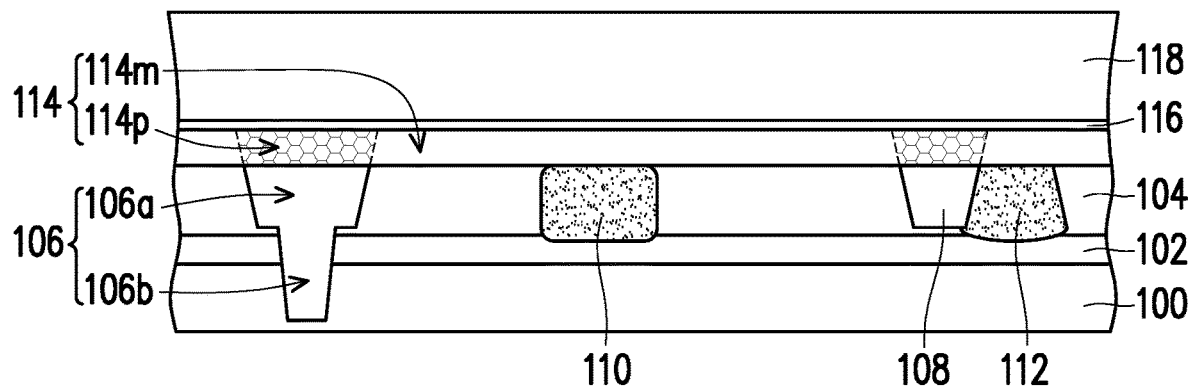

Referring to FIG. 1 and FIG. 2E, step S108 is performed, and an epitaxial layer 114, a pad layer 116 and a mask layer 118 are sequentially formed. The epitaxial layer 114, the pad layer 116 and the mask layer 118 may cover the structure shown in FIG. 2D, and lie over the epitaxial layer 104, the isolation structure 106, the isolation structure 108, the heavily doped region 110 and the heavily doped region 112. The epitaxial layer 114 may have the second conductive type, and may be functioned as a base of the eventually formed HBT device. In some embodiments, a material of the epitaxial layer 114 includes SiGe. In those embodiments where the isolation structure 106 and the isolation structure 108 are formed, portions 114p of the epitaxial layer 114 overlapped with the isolation structures 106, 108 may have a poly-crystalline phase, while other portions 114m of the epitaxial layer 114 overlapped with the epitaxial layer 104, the heavily doped region 110 and the heavily doped region 112 may have a single-crystalline phase. In certain cases, interfaces between the poly-crystalline portions 114p and the single-crystalline portions 114m (depicted as dash lines in FIG. 2E) may extend obliquely, but the present disclosure is not limited thereto. On the other hand, the pad layer 116 and the mask layer 118 are formed on the epitaxial layer 114, and the pad layer 116 is located between the epitaxial layer 114 and the mask layer 118. The pad layer 116 may have a sufficient etching selectivity with respect to the mask layer 118, in order to prevent from damaging one of the pad layer 116 and the mask layer 118 while etching the other. In some embodiments, a material of the pad layer 116 includes silicon oxide, while the mask layer 118 is made of silicon nitride. In addition, in some embodiments, the mask layer 118 may have a thickness greater than a thickness of the pad layer 116. For instance, a ratio of the thickness of the mask layer 118 with respect to the thickness of the pad layer 116 may be greater than 7.

Figure 2F:
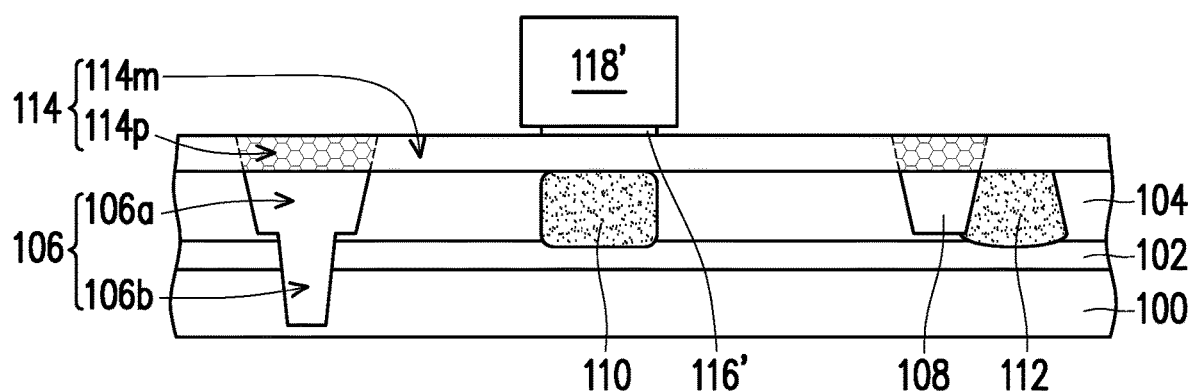

Referring to FIG. 1 and FIG. 2F, step S110 is performed, and the pad layer 116 as well as the mask layer 118 are patterned. The patterned pad layer 116 (referred as a pad pattern 116' hereinafter) and the patterned mask layer 118 (referred as a mask pattern 118' hereinafter) may be overlapped with the heavily doped region 110 formed in the epitaxial layer 104. In some embodiments, a patterning process for forming the mask pattern 118' is followed by a patterning process for forming the pad pattern 116'. In these embodiments, a photoresist pattern (not shown) may be initially formed on the mask layer 118, and then portions of the mask layer 118 are removed by an anisotropic etching process via using this photoresist patterns as a shadow mask, so as to form the mask pattern 118'. Subsequently, portions of the pad layer 116 are removed by using the mask pattern 118' as a shadow mask, so as to form the pad pattern 116'. During patterning of the pad layer 116, an isotropic etching process may be used, such that an etchant may laterally etch a portion of the pad layer 116 lying under a peripheral portion of the mask pattern 118'. Consequently, the formed pad pattern 116' may be laterally recessed from a sidewall of the mask pattern 118'. In other words, the peripheral portion of the mask pattern 118' may not be overlapped with the pad pattern 116'. Accordingly, the subsequently formed semiconductor layer 120 (as shown in FIG. 2G) may extend into the recess defined below the peripheral portion of the mask pattern 118'.

Figure 2G:
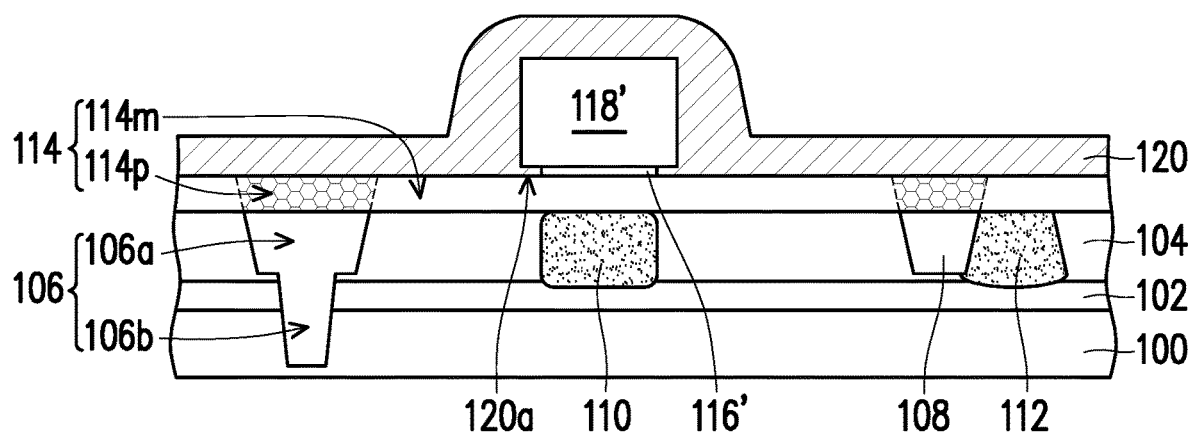

Referring to FIG. 1 and FIG. 2G, step S112 is performed, and a semiconductor layer 120 is formed. The semiconductor layer 120 may conformally cover substantially the entire structure shown in FIG. 2F. In other words, the epitaxial layer 114 and the mask pattern 118' are currently covered by the semiconductor layer 120. In addition, an extending portion 120a of the semiconductor layer 120 may further extend to the recess below the peripheral portion of the mask pattern 118'. In some embodiments, the semiconductor layer 120 is in lateral contact with the pad pattern 116'. In alternative embodiments, the semiconductor layer 120 does not reach to the pad pattern 116'. The semiconductor layer 120 is made of a semiconductor material, and has the second conductive type. In some embodiments, a doping concentration of the semiconductor layer 120 is greater than a doping concentration of the base (i.e., the epitaxial layer 114), and may be functioned as a contact layer of the base (i.e., the epitaxial layer 114). In some embodiments, a material of the semiconductor layer 120 includes polysilicon. As described above, since the semiconductor layer 120 may laterally extend into the recess below the peripheral portion of the mask pattern 118', a contact area between the semiconductor layer 120 and the epitaxial layer 114 can be increased, and a contact resistance between the semiconductor layer 120 and the epitaxial layer 114 can be accordingly reduced.

Figure 2H:
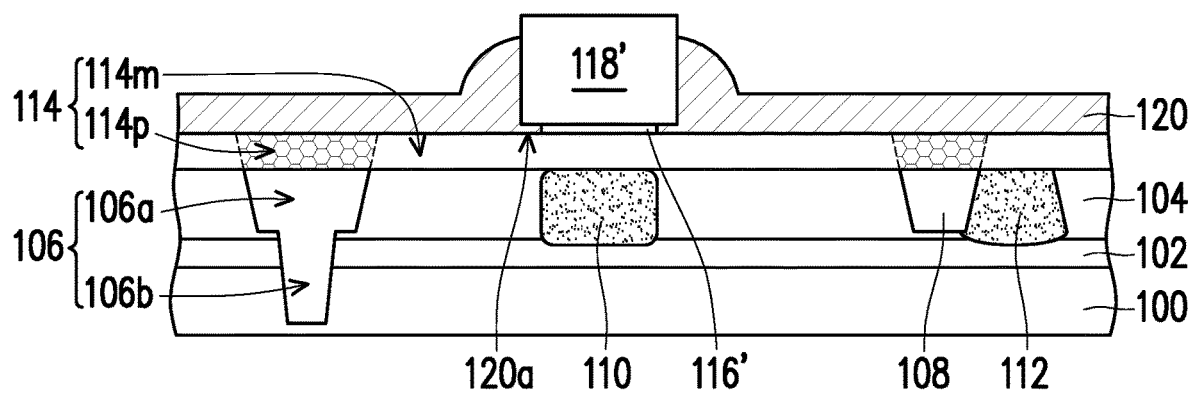

Referring to FIG. 1 and FIG. 2H, step S114 is performed, and an etch back process is performed on the semiconductor layer 120. In some embodiments, the etch back process ends when a topmost end of the semiconductor layer 120 is lower than a top surface of the mask pattern 118'. After performing the etch back process, the top surface and a portion of a sidewall of the mask pattern 118' are exposed, and the mask pattern 118' protrudes from the topmost end of the semiconductor layer 120. In addition, the semiconductor layer 120 may be thinned during the etch back process. Those skilled in the art may adjust process time of the etch back process, in order to modify a shape of the semiconductor layer 120. The present disclosure is not limited to a specific shape of the semiconductor layer 120, as long as the topmost end of the semiconductor layer 120 is lower than the top surface of the mask pattern 118'.

Figure 2I:
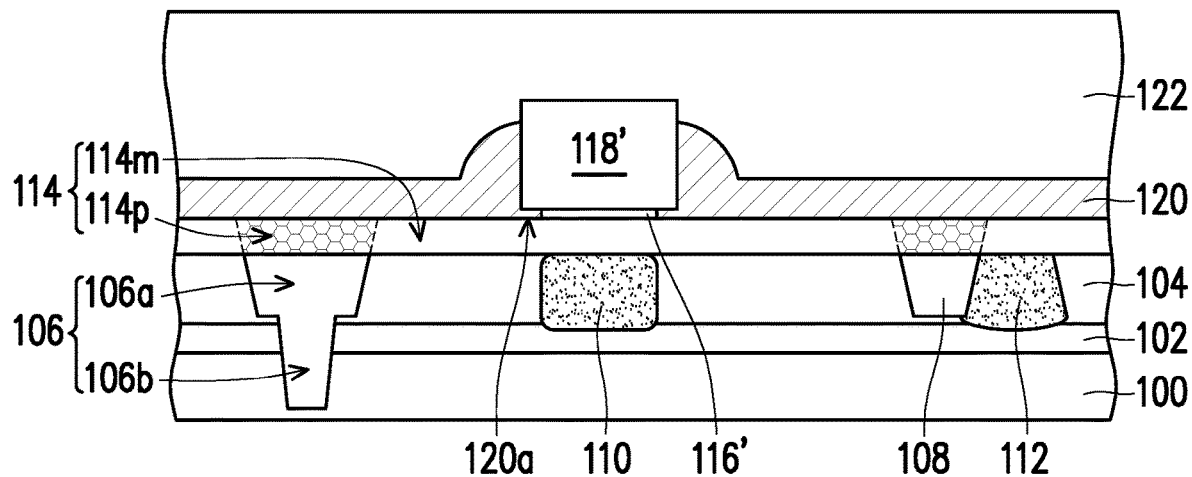

Referring to FIG. 1 and FIG. 2I, step S116 is performed, and a dielectric layer 122 is formed on the current structure. In some embodiments, the dielectric layer 122 globally covers the structure shown in FIG. 2H. In other words, a top surface of the semiconductor layer 120, the top surface of the mask pattern 118' and the previously exposed portion of the sidewall of the mask pattern 118' are covered by the dielectric layer 122. A material of the dielectric layer 122 may include silicon oxide, silicon nitride, silicon oxynitride, the like or combinations thereof.

Figure 2J:
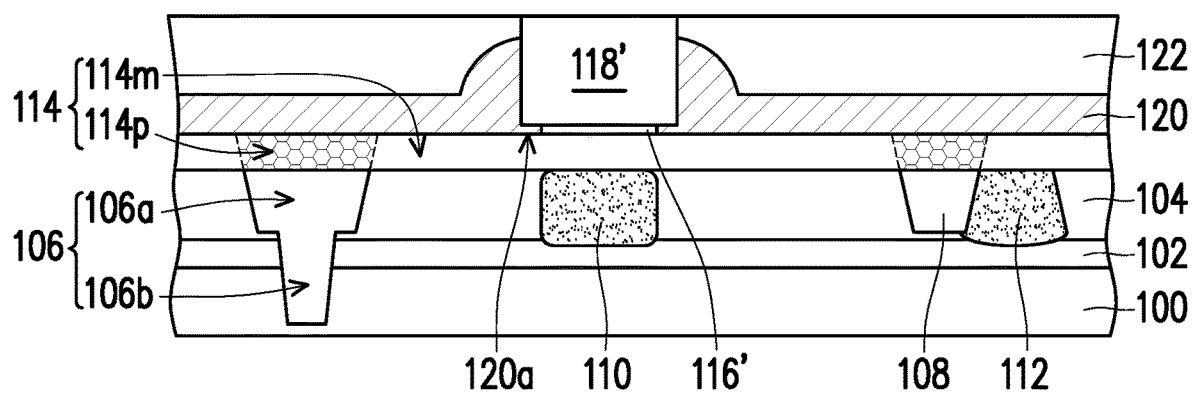

Referring to FIG. 1 and FIG. 2J, step S118 is performed, and a planarization process is performed on the dielectric layer 122. During the planarization process, a top portion of the dielectric layer 122 may be removed, such that the top surface of the mask pattern 118' can be exposed. On the other hand, the top surface of the semiconductor layer 120 as well as a top portion of the sidewall of the mask pattern 118' are still covered by the dielectric layer 122. In some embodiments, a top surface of the planarized dielectric layer 122 is substantially coplanar with the top surface of the mask pattern 118'. For instance, the planarization process may include a chemical mechanical polishing process, an etching process or a combination thereof. Since the topmost end of the semiconductor layer 120 is lower than the top surface of the mask pattern 118' as a consequence of the etch back process, the topmost end of the semiconductor layer 120 can be covered by the dielectric layer 122, and the semiconductor layer 120 can be avoided from being in direct contact with the subsequently formed emitter.

Figure 2K:
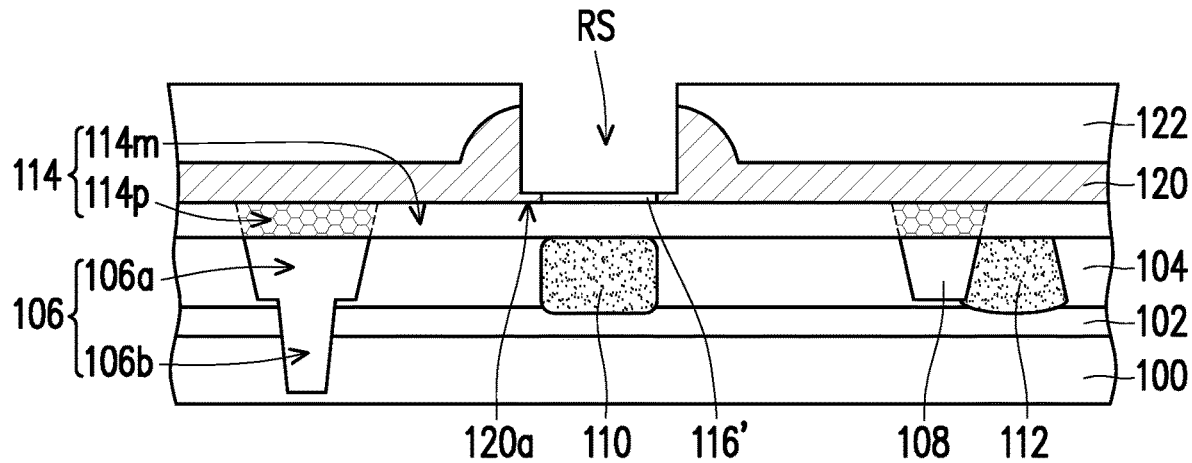

Referring to FIG. 1 and FIG. 2K, step S120 is performed, and the mask pattern 118' is removed. As a result, a recess RS is formed in the current structure, and a top surface of the pad pattern 116', a top surface of the extending portion 120a of the semiconductor layer 120, an inner sidewall of another portion of the semiconductor layer 120 and an inner sidewall of a portion of the dielectric layer 122 are exposed. The recess RS may be filled by the subsequently formed emitter. In some embodiments, the mask pattern 118' may be removed by an etching process. For instance, this etching process may be an isotropic etching process or an anisotropic etching process.

Figure 2L:
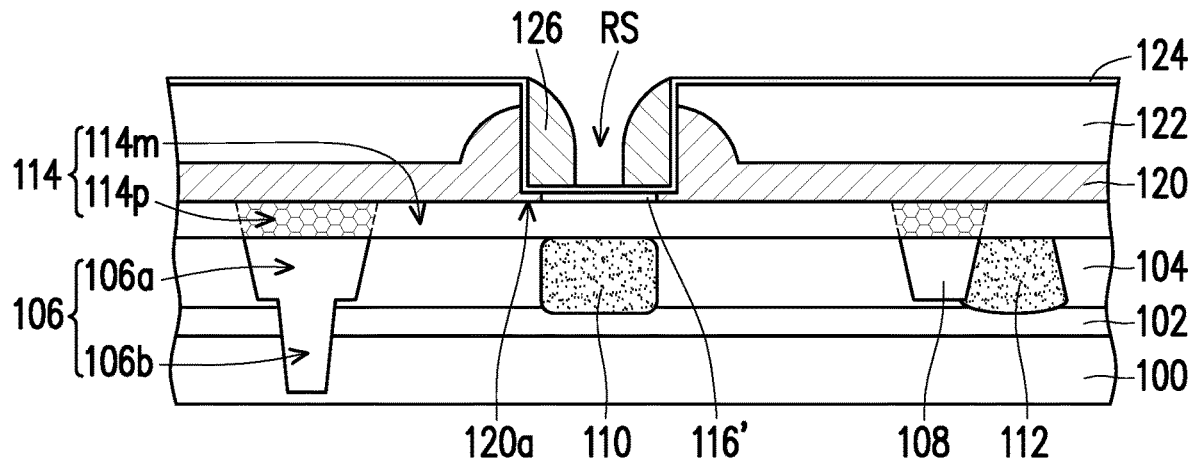

Referring to FIG. 1 and FIG. 2L, step S122 is performed, and an insulating layer 124 and a sidewall spacer 126 are sequentially formed on the current structure. The insulating layer 124 conformally covers substantially the entire structure shown in FIG. 2K, and may be made of an insulating material (e.g., silicon nitride). In the eventually formed HBT device (as shown in FIG. 2P), the semiconductor layer 120 can be electrically isolated from the subsequently formed emitter by the insulating layer 124. On the other hand, the sidewall spacer 126 is formed in the recess RS, and covers a sidewall of the recess RS. Although the sidewall spacer 126 is depicted in FIG. 2L as two separate portions, the sidewall spacer 126 may continuously extend on an inner side of the recess RS. The sidewall spacer 126 may be functioned as a shadow mask in a subsequent step, and an opening surrounded by the sidewall spacer 126 defines portions of the insulating layer 124 and the pad pattern 116' to be removed. In some embodiments, the sidewall spacer 126 covers a portion of a bottom surface of the recess RS, but at least a portion of the pad pattern 116' is not covered by the sidewall spacer 126. As shown in FIG. 2L, the sidewall spacer 126 covers the extending portion 120a of the semiconductor layer 120 and a peripheral portion of the pad pattern 116', but a central portion of the pad pattern 116' is not covered by the sidewall spacer 126. In some embodiments, the sidewall spacer 126 may be made of a semiconductor material (e.g., polysilicon). In addition, in some embodiments, a method for forming the sidewall spacer 126 includes globally forming a sidewall spacer material layer (not shown) on the insulating layer 124. Subsequently, a portion of the sidewall spacer material layer above the top surface of the dielectric layer 122 and a portion of the sidewall spacer material layer within a central region of the recess RS are removed by, for example, an anisotropic etching process, so as to form the sidewall spacer 126 as shown in FIG. 2L.

Figure 2M:
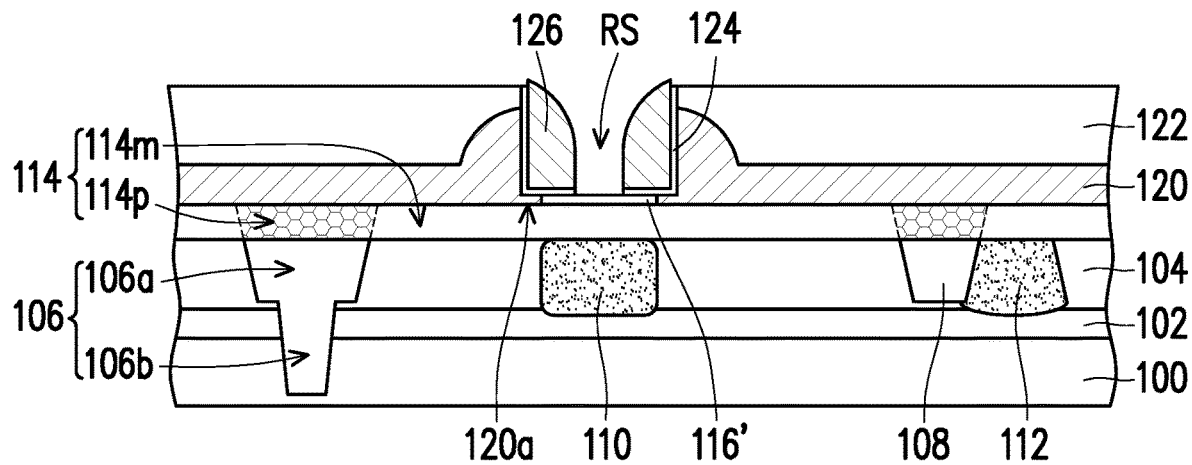

Referring to FIG. 1 and FIG. 2M, step S124 is performed, and exposed portions of the insulating layer 124 are removed by using the sidewall spacer 126 as a shadow mask. As shown in FIG. 2L and FIG. 2M, a portion of the insulating layer 124 above the top surface of the dielectric layer 122 and another portion of the insulating layer 124 surrounded by the sidewall spacer 126 are removed, and the top surface of the dielectric layer 122 and the central portion of the pad pattern 116' are exposed. As shown in FIG. 2M, cross-sectional view of the remained portion of the insulating layer 124 appears as two separate L-shape patterns. In addition, a top end of the sidewall spacer 126 may be higher than a top surface of the dielectric layer 122 and a top end of the remained portion of the insulating layer 124. In some embodiments, an etching process (e.g., an anisotropic etching process) may be used for removing the fore-mentioned portions of the insulating layer 124.

Figure 2N:
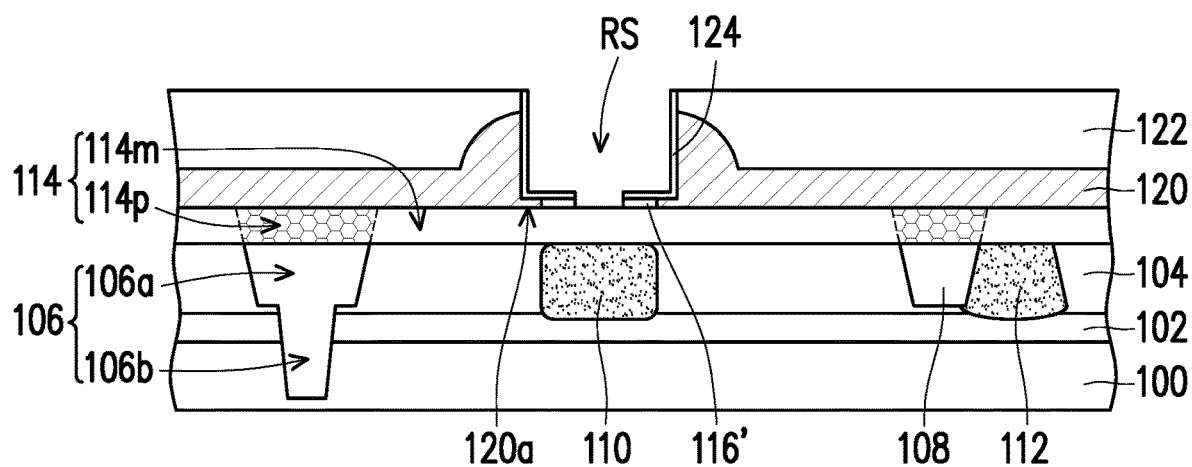

Referring to FIG. 1 and FIG. 2N, step S126 is performed, and the sidewall spacer 126 and the exposed portion of the pad pattern 116' are removed. The remained portion of the insulating layer 124 is exposed once the sidewall spacer 126 is removed. In some embodiments, an etching process (e.g., an isotropic etching process) may be used for removing the sidewall spacer 126. After the removal of the sidewall spacer 126, a portion of the pad pattern 116' not covered by the insulating layer 124 may be removed by another etching process, and a portion of the underlying epitaxial layer 114 is accordingly exposed. In this way, the base (i.e., the epitaxial layer 114) can be in contact with the subsequently formed emitter. In some embodiments, the etching process for removing the afore-mentioned portion of the pad pattern 116' is an isotropic etching process (e.g., a wet etching process). In these embodiments, since the pad pattern 116' may have sufficient etching selectivity with respect to the epitaxial layer 114, the epitaxial layer 114 may be avoided from subjecting to damages during the etching process of the pad pattern 116'. In certain embodiments, the exposed portion of the epitaxial layer 114 has a substantially flat top surface.

Figure 2O:
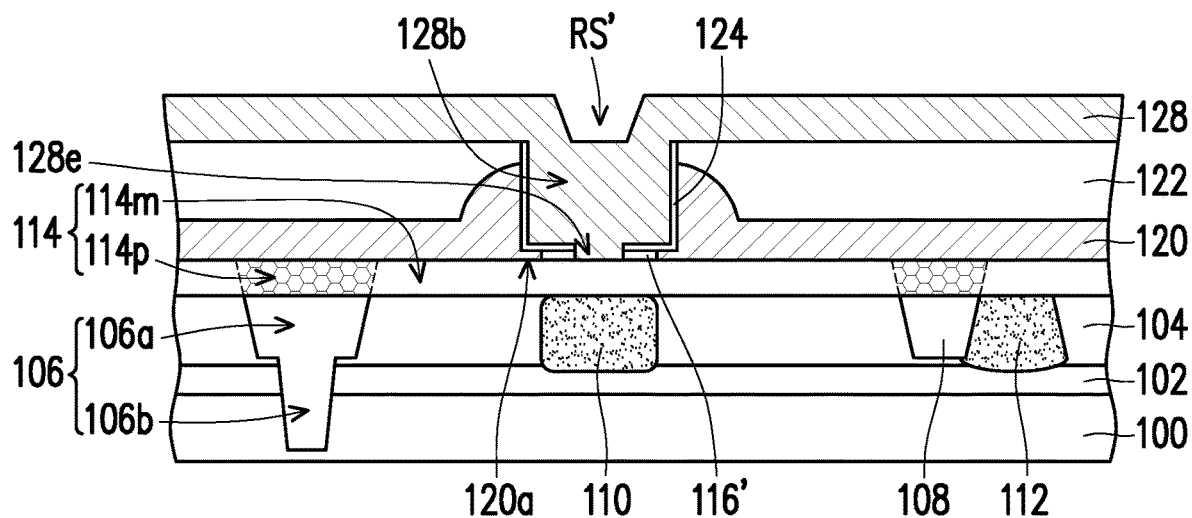
Figure 2P:
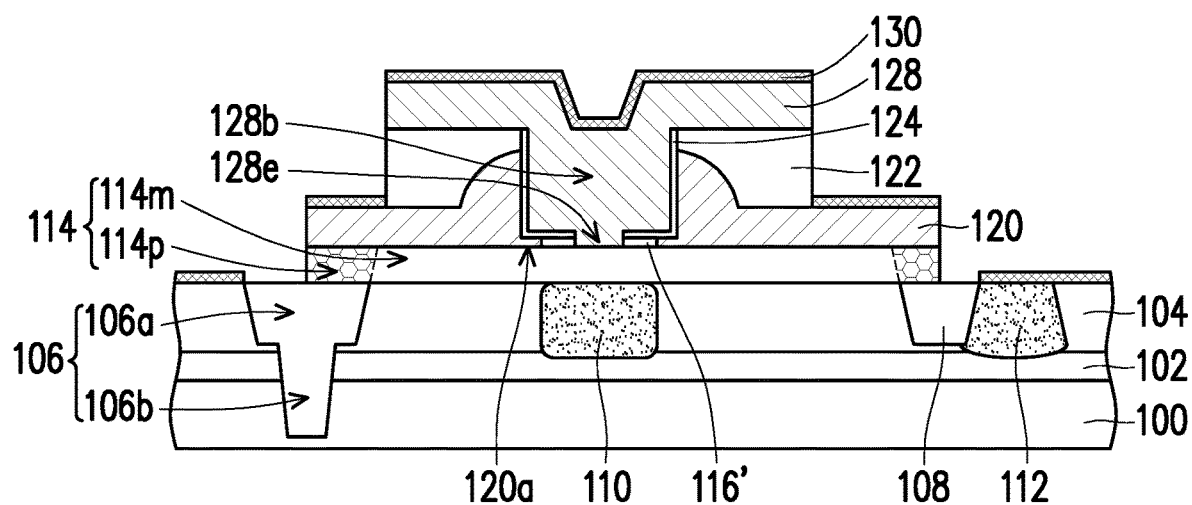

Referring to FIG. 1 and FIG. 2O, step S128 is performed, and a semiconductor layer 128 is formed. In some embodiments, the semiconductor layer 128 may be globally formed on the structure shown in FIG. 2N, and the recess RS may be filled by the semiconductor layer 128. In other words, the top surface of the dielectric layer 122, a surface of the insulating layer 124 and a sidewall of the pad pattern 116' may be covered by the semiconductor layer 128, and the semiconductor layer 128 is in contact with a portion of the epitaxial layer 114. In some embodiments, a top surface of the semiconductor layer 128 has a recess RS' corresponding to the recess RS (as shown in FIG. 2M). The semiconductor layer 128 may be made of a semiconductor material with the first conductive type, and may be functioned as an emitter of the eventually formed HBT device. The semiconductor material of the emitter (i.e., the semiconductor layer 128) may be different from the semiconductor material of the base (i.e., the epitaxial layer 114), thus a heterojunction is formed between the emitter and the base. For instance, a material of the semiconductor layer 128 may include polysilicon, and a material of the epitaxial layer 114 may include SiGe. In addition, along a vertical direction, the semiconductor layer 128 may be electrically isolated from the semiconductor layer 120 by the dielectric layer 122. On the other hand, along a lateral direction, the semiconductor layer 128 may be electrically isolated from the semiconductor layer 120 by the insulating layer 124 and the pad pattern 116'.

Referring to FIG. 1 and FIG. 2P, step S130 is performed, and the epitaxial layer 114, the semiconductor layer 120, the dielectric layer 122 and the semiconductor layer 128 are patterned. The patterned epitaxial layer 114, semiconductor layer 120, dielectric layer 122 and semiconductor layer 128 may be overlapped with the active region defined by the isolation structures 106, 108, and the heavily doped region 112 outside the active region may be currently exposed. In some embodiments, a lithography process and one or more etching process may be used for patterning the semiconductor layer 128 and the dielectric layer 122. Subsequently, another lithography process and at least one etching process may be used for patterning the semiconductor layer 120 and the epitaxial layer 114. In these embodiments, the patterned semiconductor layer 128 and dielectric layer 114 may have a first footprint area, and spread within a span of the active region defined by the isolation structures 106, 108. On the other hand, the patterned semiconductor layer 120 and epitaxial layer 114 may have a second footprint area. The second footprint area may be greater than the first footprint area, such that a portion of the semiconductor layer 120 is not covered by the dielectric layer 122 and the semiconductor layer 128. In addition, the patterned semiconductor layer 120 and epitaxial layer 114 may be at least partially overlapped with the isolation structures 106, 108. Alternatively, the patterned semiconductor layer 120 and epitaxial layer 114 may not be overlapped with the isolation structures 106, 108.

In some embodiments, metal silicide layers 130 may be formed on exposed surfaces of the semiconductor layer 128, the semiconductor layer 120 and the epitaxial layer 104. For instance, a material of the metal silicide layer 130 may include CoSi, TiSi, NiSi, the like or combinations thereof. In those embodiments where the semiconductor layer 128, the semiconductor layer 120 and the epitaxial layer 104 are made of silicon-containing material(s), exposed portions of the semiconductor layer 128, the semiconductor layer 120 and the epitaxial layer 104 may react with metal elements during a thermal treatment, and the metal silicide is accordingly formed. However, those skilled in the art may select other viable method for forming the metal silicide layer 130 according to process requirements, the present disclosure is not limited thereto.

Up to here, a HBT device 10 has been formed. As shown in FIG. 2P, the HBT device 10 may be a mesa-type HBT device. In other words, at least some portion of the HBT device 10 are formed on the substrate 100, and these portions may be formed as a stacking structure with a mesa portion. The well region 102 and the epitaxial layer 104 (or the well region 102, the epitaxial layer 104 and the heavily doped region 110) may collectively be functioned as the collector of the HBT device 10, and have the first conductive type. The heavily doped region 112 formed in the epitaxial layer 104 may be functioned as a contact region of the collector, and also has the first conductive type. In addition, the epitaxial layer 114 may be functioned as the base of the HBT device 10, and has the second conductive type. The semiconductor layer 120 formed on the epitaxial layer 114 also has the second conductive type, and may be functioned as a contact layer of the base (i.e., the epitaxial layer 114). Moreover, the semiconductor layer 128, which extends through the semiconductor layer 120 and is in contact with the epitaxial layer 114 (the base), may be functioned as the emitter of the HBT device 10, and has the first conductive type. A vertically extending portion of the semiconductor layer 128 is surrounded by the semiconductor layer 120, and can be regarded as having a body portion 128$b$ and an extending portion 128$e$ extending downwardly from the body portion 128$b$ to a top surface of the epitaxial layer 114. The body portion 128$b$ has a width greater than a width of the extending portion 128$e$, and a portion of the semiconductor layer 120 (i.e., the extending portion 120$a$ of the semiconductor layer 120) extends between the body portion 128$b$ of the semiconductor layer 128 and the epitaxial layer 114. Therefore, a contact area between the semiconductor layer 120 and the epitaxial layer 114 is increased, and a contact resistance between the semiconductor layer 120 and the epitaxial layer 114 is reduced. Such contact resistance is in negative correlation to an operation frequency of the HBT device 10. In other words, reduction of such contact resistance may allow the HBT device 10 to be operated under higher frequency. On the other hand, the extending portion 120$a$ of the semiconductor layer 120 may be electrically isolated form the semiconductor layer 128 by the insulating layer 124 and the pad pattern 116'.

Although not shown, other semiconductor devices may be formed in/on the substrate 100 along with the HBT device 10, and interconnection structures may be formed above the HBT device 10 and these semiconductor devices. For instance, these semiconductor devices may include homogeneous BJT device(s), metal-oxide-semiconductor (MOS) field effect transistor(s), the like or combinations thereof.

As above, the semiconductor device of the present disclosure may be a HBT device, and includes an epitaxial layer as a base, a semiconductor layer as a contact layer of the base, and another semiconductor layer as an emitter. The emitter extends to the base from above the base, and a vertically extending region of the emitter has a body portion and an extending portion extending from a bottom end of the body portion to a top surface of the base. The base contact layer laterally surrounds the vertically extending region, and further extends to a recess defined between the body portion of the emitter and the base. As a result, a contact area between the base contact layer and the base is increased, and a contact resistance between the base contact layer and the base is reduced. Such contact resistance is in negative correlation to an operation frequency of the semiconductor device. Therefore, reduction of such contact resistance may allow the semiconductor device to be operated under higher frequency.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a semiconductor device, comprising:

sequentially forming a first epitaxial layer and a second epitaxial layer on a substrate;

forming a pad pattern and a mask pattern on the second epitaxial layer, wherein the pad pattern is located between the second epitaxial layer and the mask pattern, and a sidewall of the pad pattern is laterally recessed from a sidewall of the mask pattern;

forming a first semiconductor layer on the second epitaxial layer, wherein a sidewall of the mask pattern is covered by the first semiconductor layer, the first semiconductor layer extends to a space between the mask pattern and the second epitaxial layer, and a topmost end of the first semiconductor layer is lower than a top surface of the mask pattern;
removing the mask pattern, to expose an inner sidewall of the first semiconductor layer and a top surface of the pad pattern;
removing a central portion of the pad pattern, to expose a portion of the second epitaxial layer; and
forming a second semiconductor layer on the exposed portion of the second epitaxial layer.

2. The manufacturing method of the semiconductor device according to claim 1, wherein a method for forming the first semiconductor layer comprises:
forming a semiconductor material layer on the second epitaxial layer, wherein the mask pattern is covered by the semiconductor material layer; and
performing an etch back process on the semiconductor material layer, to form the first semiconductor layer.

3. The manufacturing method of the semiconductor device according to claim 1, further comprising:
forming an insulating layer covering the inner sidewall of the first semiconductor layer and the top surface of the pad pattern after removal of the mask pattern;
forming a sidewall spacer on the insulating layer, wherein the inner sidewall of the first semiconductor layer and a peripheral portion of the pad pattern are covered by the sidewall spacer;
removing a portion of the insulating layer by using the sidewall spacer as a shadow mask, so as to expose the central portion of the pad pattern; and
removing the sidewall spacer before removal of the central portion of the pad pattern.

4. The manufacturing method of the semiconductor device according to claim 1, wherein the central portion of the pad pattern is removed by an isotropic etching process.

* * * * *